United States Patent [19]

Kubinec

[11] Patent Number: 5,479,135
[45] Date of Patent: Dec. 26, 1995

[54] METHOD OF ULTRA-HIGH FREQUENCY CURRENT AMPLIFICATION USING MOSFET DEVICES

[75] Inventor: James Kubinec, Reno, Nev.

[73] Assignee: Advanced Micro Devices, Inc., Sunnyvale, Calif.

[21] Appl. No.: 180,261

[22] Filed: Jan. 12, 1994

[51] Int. Cl.$^6$ .................................................. H03F 3/16
[52] U.S. Cl. ........................... 330/277; 330/310; 330/288
[58] Field of Search .................................... 330/277, 286, 330/288, 310, 307

[56] References Cited

U.S. PATENT DOCUMENTS

| | | | |
|---|---|---|---|
| 4,361,771 | 11/1982 | Reinke | 330/288 X |
| 4,550,284 | 10/1985 | Sooch | 330/288 X |
| 4,618,815 | 10/1986 | Swanson | 330/288 X |
| 4,686,487 | 8/1987 | Radovsky | 330/288 |
| 5,010,304 | 4/1991 | Mueller et al. | 330/277 X |
| 5,325,072 | 6/1994 | Kohjiro et al. | 330/286 |

OTHER PUBLICATIONS

Patent Abstracts of Japan, vol. 11, No. 41 (E–478) Feb. 6, 1987 Japan.

Patent Abstracts of Japan, vol. 12, No. 200 (E–619) Jun. 9, 1988 Japan.

*Primary Examiner*—Steven Mottola
*Attorney, Agent, or Firm*—Skjerven, Morrill, MacPherson, Franklin & Friel; Philip J. McKay; Forrest E. Gunnison

[57] ABSTRACT

A method of high frequency current signal amplification utilizing Metal-Oxide-Silicon Field Effect Transistors (MOSFETS) allows the use of MOSFETS for current signal amplification in the radio frequency (RF) range of the electromagnetic spectrum and minimizes the effects of parasitic capacitance. A current signal is applied to pluralities of MOSFETS arranged in amplification stages such that the amplification of the input current signal is determined by the ratio of the channel widths of the MOSFETS employed. Alternating amplification stages comprised of N-conductivity type and P-conductivity type devices are employed. The amplification of the signal can be precisely controlled by both the width of the channels within the MOSFETS and the number of current signal amplification stages employed. The output signal can also be converted to a voltage signal by coupling to a source of resistance or reactance.

29 Claims, 10 Drawing Sheets

METHOD OF ULTRA-HIGH FREQUENCY CURRENT AMPLIFICATION USING MOSFET DEVICES

FIELD OF THE INVENTION

This invention is related to a method of high frequency current signal amplification and in particular to radio frequency amplifiers utilizing metal oxide silicon field effect transistors.

BACKGROUND OF THE INVENTION

Interconnections and communications between computer circuitry is becoming increasingly important as information networks expand. Also, as personal computers become smaller and cellular telephone communications become more widely utilized, the integration of computer technology and wide area communication is expected to substantially increase. In addition to telephone communications, radio frequency communications are starting to play a more important role in communication interfaces between computer circuitry.

The use of radio frequency communications has been recognized by the federal government. The Federal Communications Commission (F.C.C.) has allocated two radio frequency bands for unlicensed use. The frequencies allocated by the F.C.C. are approximately 900 megahertz and 2.4 gigahertz.

Most computer circuitry is formed using Complementary Metal Oxide Silicon (CMOS) processes. CMOS circuitry has been clocked with frequencies up to 66 MHz and the current state of the art is about 100 MHz. Until now pushing CMOS circuitry to frequencies well beyond 100 MHz has not appeared feasible. For example, a junction capacitance of five picofarads at 100 MHz has an impedance of 320 ohms. Thus, CMOS circuitry has not appeared to be a candidate for use with the unlicensed radio frequencies listed above.

Specifically, the characteristics of Metal-Oxide-Silicon Field Effect Transistors (hereafter MOSFETs) create serious problems when used with radio frequencies. For the most part these problems are the result of inherent parasitic capacitances created at the junctions of the various layers of a MOSFET and the interconnections between MOSFET devices and other devices within a circuit.

To better understand the effects of the parasitic capacitances, consider a N-conductivity type MOSFET 100 (FIG. 1) that includes a source region 101 and a drain region 102 formed in a P-type silicon substrate 105. A silicon dioxide layer 104, sometimes referred to as an oxide layer, separates a gate 103 from an upper surface 105A of substrate 105.

Figure 1:
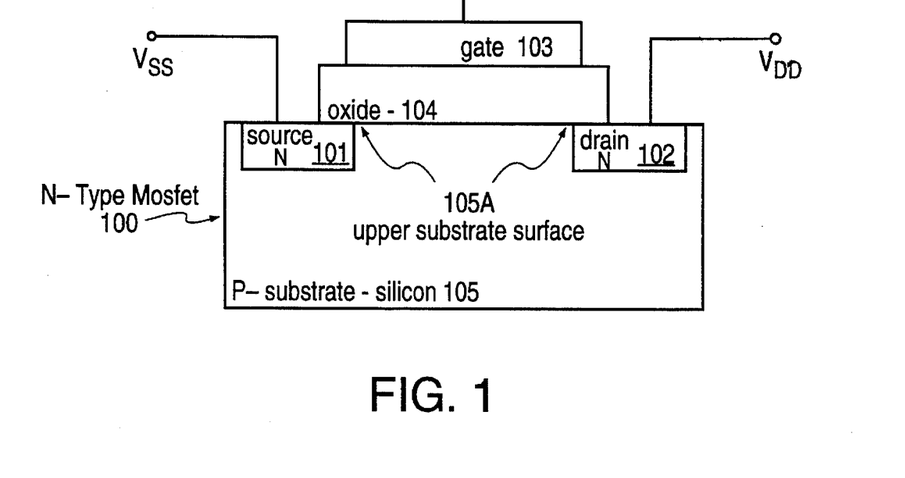
FIG. 1 shows a N-conductivity type Metal-Oxide-Silicon Field Effect Transistor (MOSFET) Construction diagram.
Figure 2:
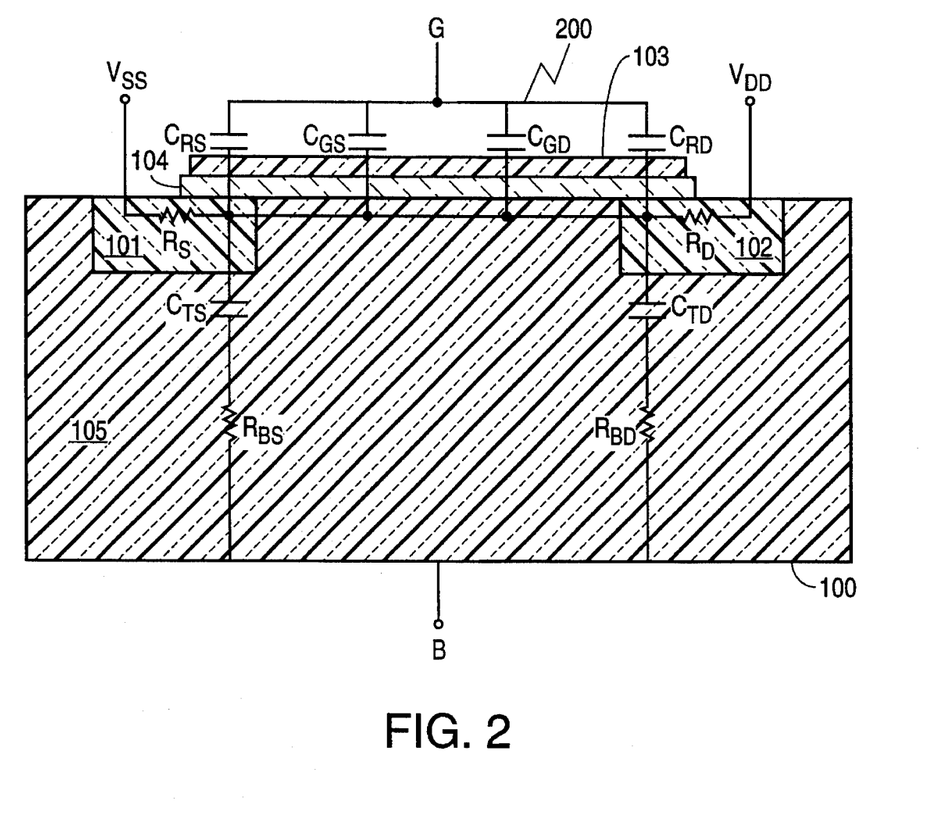
FIG. 2 shows a schematic representation of the equivalent circuit of the MOSFET of FIG. 1.

FIG. 2 is a schematic representation of an electronically equivalent circuit 200 for MOSFET 100 that explicitly shows parasitic capacitances CRS, CGS, CGD, CRD, CTS and CTD.

CRS is the capacitance resulting from misalignment and overlap of gate 103 with respect to the source 101 diffusion. CRD is the capacitance resulting from misalignment and overlap of gate 103 with respect to the drain 102 diffusion.

The capacitances CTS and CTD are depletion-region capacitances at the reverse-biased pn junctions.

Capacitances CGS and CGD are inherent to the device and represent the flux linkages to the channel charge which gives rise to the basic operation of the device.

As noted above, capacitances CGS and CTD are the only capacitances theoretically inherent to the device, however, as a practical manufacturing limitation capacitances CRS, CRD, CTS, and CTD will also be inherent to any physically existing MOSFET.

The parasitic capacitances illustrated in FIG. 2 impede and prevent rapid voltage changes associated with radio frequency operation. Further, these parasitic capacitances effectively operate as part of a low pass RC filter in that the combination of the parasitic capacitances and the load resistance makes the device attenuate high frequency voltage changes. Additionally, the capacitance of the electrical connections between the various MOSFETs in a circuit and between MOSFETS and other circuit components is another source of parasitic capacitance and is often the most serious source of problems when attempting to amplify high frequency voltage signals.

Consequently, MOS circuitry and in particular CMOS circuitry has not generally been considered acceptable for use in radio frequency applications. As a result, large portions of the electro-magnetic spectrum have been thought to be useless for applications involving MOSFET devices.

SUMMARY OF THE INVENTION

According to the principles of this invention, a method of high frequency current signal amplification using Metal-Oxide-Silicon (MOS) circuits provides for wide bandwidth current amplifiers which can accommodate current signals in the radio frequency (RF) portion of the electro-magnetic spectrum. One or more Metal-Oxide-Silicon Field Effect Transistor (MOSFET) amplification stages are utilized. Each amplification stage uses the physical dimensions of the MOSFETS to supply a predetermined amplification of an input current signal. The MOSFETS are configured so as to minimize the effects of the parasitic capacitances within the MOSFETS themselves and of interconnections between circuit components. Very precise levels of current signal amplification are obtained for frequencies once thought beyond the capability of MOS devices. Amplification stages can be coupled into complementary Metal Oxide Silicon circuits which provide maximum flexibility of design and large signal gain potential, while using standard, commercially available devices. Furthermore, the method allows for smaller supply voltages then was possible in prior art voltage amplifiers and the resultant amplified current signal is not affected by any noise generated in the power supply.

DETAILED DESCRIPTION

According to the principles of this invention, Metal-Oxide-Silicon (MOS) circuits, and in particular Complimentary-Metal-Oxide-Silicon (CMOS) circuits, are utilized for broad-band current amplification thereby facilitating the interface between Radio Frequency (RF) communications and CMOS computer circuitry or other CMOS digital circuitry. The limiting factor for the use of the current amplification method of this invention is the ability of the MOS circuitry to amplify the input current signals.

The novel method of broad-band current amplification of this invention eliminates the effects of inherent parasitic capacitances of MOS circuitry so that existing MOS circuitry of the 0.5 to 1.0 micron feature size can operate in frequency ranges as high as ten to fourteen gigahertz. Of course, as technology advances the feature size of future generations of MOS circuitry will decrease and there will be a corresponding increase in the frequencies future MOS devices can handle. It follows that the utility of the method of the present invention lies not only in its application to existing MOS devices but also in its use with future generations of MOS devices which will operate in even higher frequency ranges where, as explained below, the effects of parasitic capacitance would be even more fatal using prior art methods of voltage amplification.

The method of this invention operates the MOS broad-band current amplifiers so that small changes in voltage produce large changes in current, i.e., current amplification. The small changes in voltage are defined so that current flow through the parasitic capacitances is approximately zero.

This is accomplished by utilizing the fact that if the voltage swings with respect to time across components of a Metal-Oxide-Silicon Field Effect Transistor (MOSFET) are small, i.e., dv/dt is approximately zero, the current through the parasitic capacitance is approximately zero. Specifically, current ICAP through a parasitic capacitive element is equal to parasitic capacitance C multiplied by the change in voltage with respect to time dv/dt, i.e., $$ICAP = C \frac{dv}{dt}$$

Thus, a $$\frac{dv}{dt}$$

approaches zero, the effect of parasitic capacitance C approaches zero.

According to the method of this invention, a radio frequency (RF) current signal 351 (See FIG. 3) is applied to an input line 553 (see FIG. 5) of a first RF amplification stage 502 which includes a plurality of MOSFETS having a conductivity channel of a first type.

Figure 3:
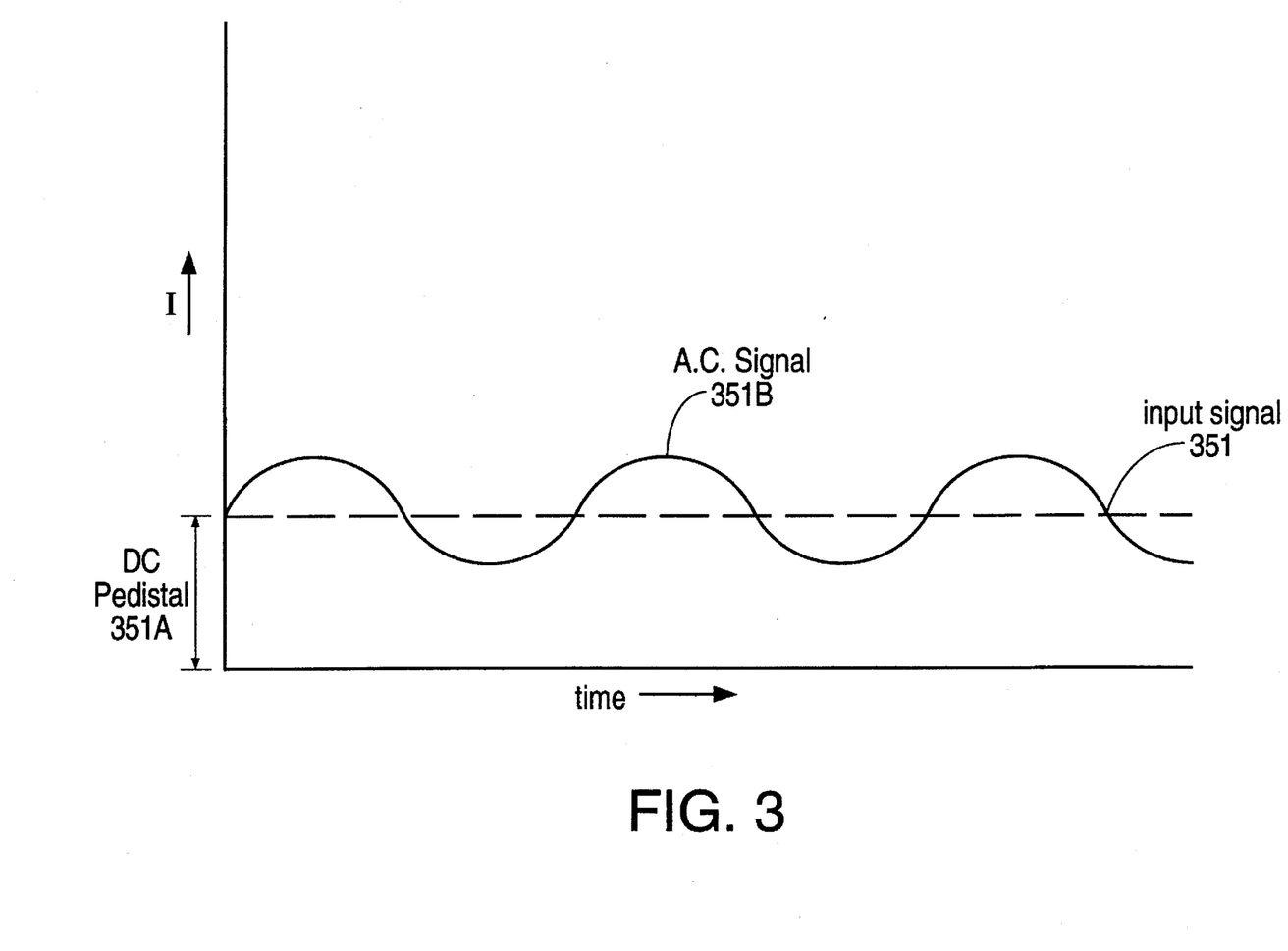
FIG. 3 is a graphical representation of a typical input signal used with the method of this invention.

RF current signal 351, in this embodiment, is an alternating current (AC) signal 351B superimposed on a direct current (DC) "pedestal" current 351A. (FIG. 3). Pedestal current 351A can be supplied by any one of numerous methods known to those skilled in the art and is necessary to prevent negative going current flow in first RF amplification stage 502. AC signal 351B of RF current signal 351 can be supplied by any RF current source such as a radio antenna, signal generator, or other circuitry.

Figure 4:
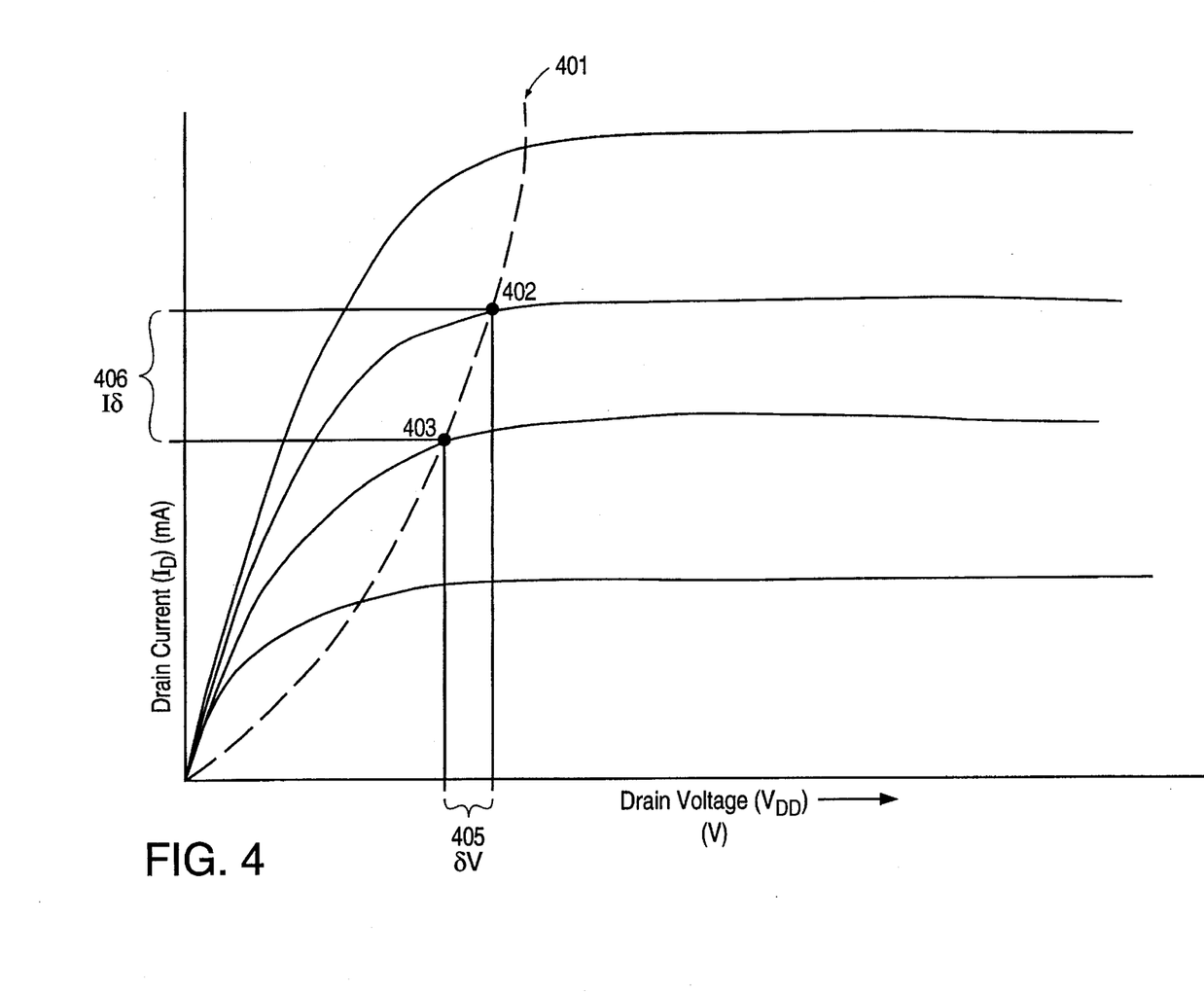
FIG. 4 is a graph of drain voltage (in volts) versus drain current (in milliamperes) and an operation curve for a MOSFET used in accordance with the method of this invention.

RF amplification stage 502 utilizes the geometric characteristics of the plurality of MOSFETs to create a predetermined amplification of RF current signal 351. Specifically, the plurality of MOSFETs in first RF amplification stage 502 are operated in the voltage ranges defined by curve 401 (see FIG. 4). In FIG. 4, the horizontal axis is the drain voltage, in volts, and the vertical axis is the drain current, in milliamps, of a typical MOSFET. Curve 401 represents those points where voltage VGD between the gate and the drain of the MOSFET is zero, that is to say where the gate and drain voltage are the same. Curve 401 is defined by the following equation:

$$IDS = \frac{W\beta}{L} (VG - VT)^2$$

where:
 IDS=Drain to Source current
 VT=The threshold voltage at the source
 VG=Voltage on the gate
 W=The channel width of the MOSFET (see FIG. 6A)
 L=The channel length of the MOSFET (see FIG. 6A)
 β=A constant
 (VG-VT)=Effective gate bias Notice that when the MOSFETs are operated along curve 401, a small change (δV) 405 in drain voltage results in a corresponding large change (δI) 406 in drain current. This is represented in FIG. 4 by the change in drain current 406 which is relatively large compared to the change in drain voltage 405 associated with the movement between points 403 and 402 along curve 401. Of course, the result is a large amplification of current for a corresponding small change in voltage. Note that small changes in voltage means minimal effects from parasitic capacitance as explained above. Furthermore, as explained more completely below, the amplification achieved by the method of this invention is dependent only on the physical dimensions of the devices used and not the supply voltage.

Referring back to FIG. 5, first RF amplification stage 502 creates an amplified current signal 554 (herein, the signal on a line and the line have the same reference numeral for convenience) which is coupled to input line 555 of a second RF amplification stage 504. The second RF amplification stage 504 also uses a plurality of MOSFETs to create a second predetermined amplification of current signal 351. The amplified current signal from RF amplification stage 504 is generated on line 556.

Figure 5:
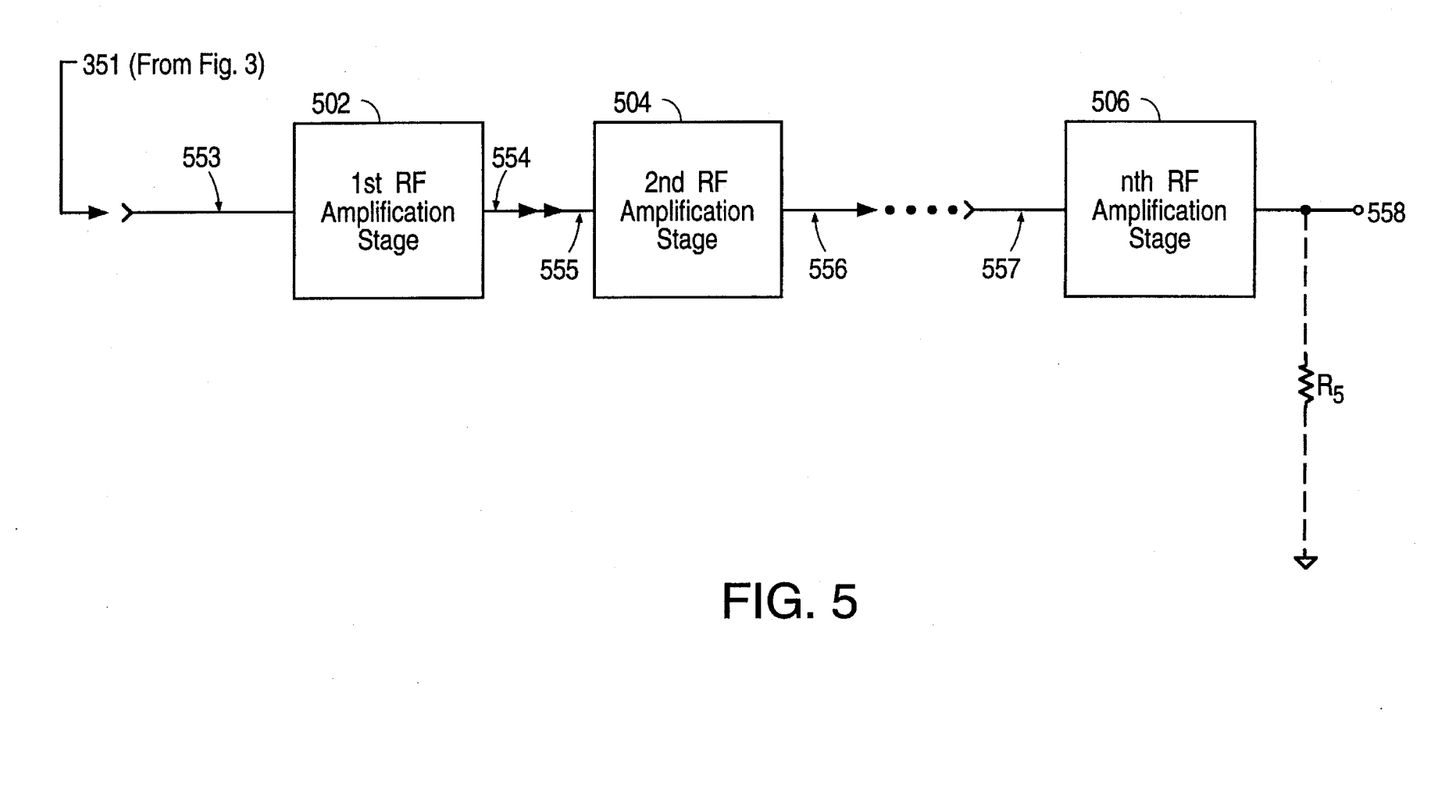
FIG. 5 is a block diagram of an amplifier utilizing the method of this invention to produce current signal amplification.

The second RF amplification stage 504, like RF amplification stage 502, utilizes the geometric characteristics of the plurality of MOSFETs to create a predetermined amplification of RF current signal 554. Specifically, as explained above, the plurality of MOSFETs in second RF amplification stage 504 are operated in the voltage ranges defined by curve 401 (see FIG. 4). However, the plurality of MOSFETs in second RF amplification stage 504 have a conductivity channel type that is the opposite conductivity channel type of the plurality of MOSFETs in first RF amplification stage 502.

Any number of RF amplification stages can be interconnected, according to the principles of this invention, so long as each amplification stage has MOSFETs with a conductivity channel type that is different from the conductivity channel type of the MOSFETs in the directly preceding amplification stage. For instance, if second amplification stage 504 is a P-conductivity type (also known as a P-type) then a third amplification stage, directly following stage 504, must be a N-conductivity type (also known as a N-type). Each stage can be configured to have any desired amplification as explained below.

Hence, the series of amplification stages can continue up to and include a final or "nth" amplification stage 506. The nth amplification stage receives the (n-1) amplification of the current signal 351 on input line 557. After having been amplified n times, the amplified current signal is coupled to output line 558. If a voltage signal is desired after nth amplification stage 506, the amplified current signal 558 can be passed through a resistance or reactance R5 and the voltage can be measured across resistance R5.

This method of RF current amplification is highly advantageous over the prior art in that by utilizing a current signal with MOS circuity the voltage swings on the MOSFETs in RF amplification stages 502, 504, . . . , 506 become much smaller than the voltage swings prior art methods created; so small that they become insignificant to the system and can be approximated as zero which, of course, is the ideal value. Thus, with the method of this invention, the parasitic capacitance does not limit the frequency response. This allows amplification of high frequency signals, including signals in the radio frequency ranges.

Another advantage of the method of the present invention is that a broad range of current signal frequencies can be accommodated, thus allowing creation of a broad-band current amplification device. FIG. 5B is a graph of the current gain (IGAIN) as a function of frequency (f) which is obtained by employing the method of this invention. Note that a literal continuum of frequencies can be accommodated up to the frequency FT 563. Frequency FT 563 is that frequency at which a MOSFET's gain drops to one and no current amplification is obtained. Frequency FT 563 is primarily a function of the feature size of the device, with larger feature size MOSFETs having smaller values of frequency FT and smaller feature size MOSFETs having larger values of frequency FT. As noted above, present technology is creating MOSFETS with a feature size in the 0.5 to 1.0 micron range which have frequencies FT of about 10 to 14 GHz. In the future, frequency FT will undoubtedly increase as MOSFET feature sizes get smaller. It follows that as technology advances and new generations of smaller feature size MOSFETS are created, the bandwidth of amplifiers using the method of this invention will get broader. Note that not only frequencies in the radio range (including 900 mHz 561 and 2.4 GHZ 562) can be accommodated by this method, but also frequencies considerably above 2.4 GHz 562 and all frequencies below frequency FT 563. Thus, using the method of this invention, a current signal bandwidth extending from zero Hz to frequency FT can be amplified and an amplifier can be created which has a broader bandwidth than is possible using prior art methods.

Furthermore, as will be explained below, selection of the channel widths of the various MOSFETs enables the designer to produce very precise levels of amplification within each stage.

Finally, by coupling amplification stages, large current signal gains can be achieved using standard MOSFET's.

Figure 5A:
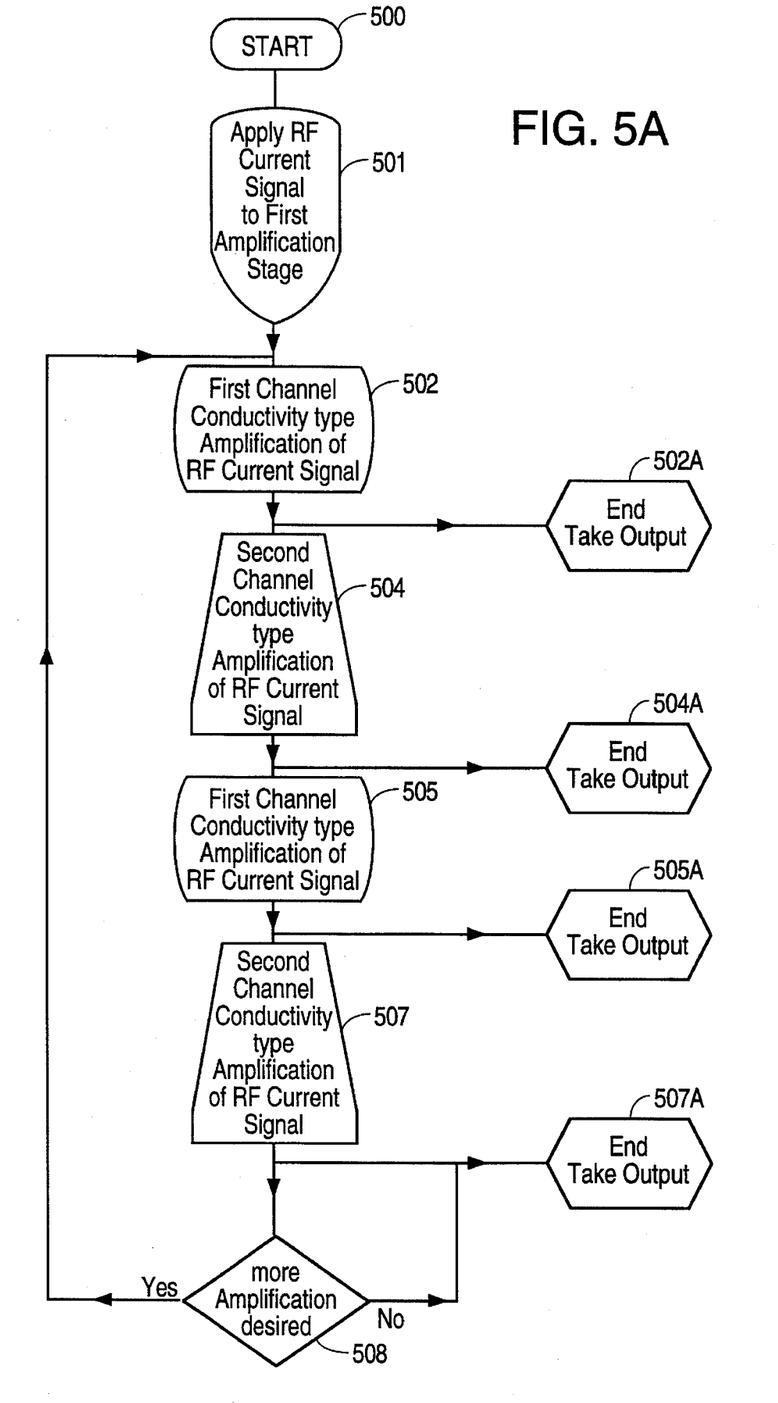
FIG. 5A is a flow-chart diagram of the method of this invention.
Figure 5B:
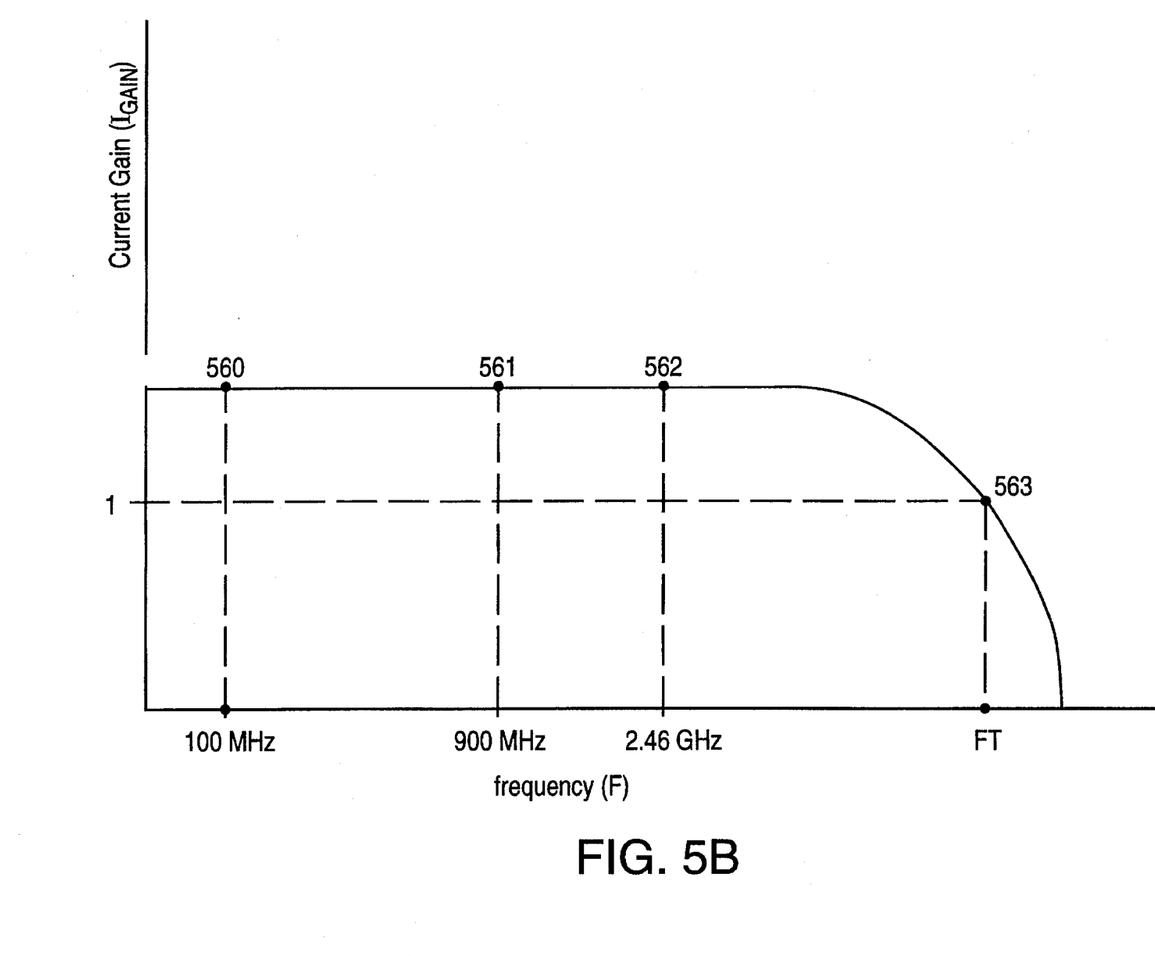
FIG. 5B is a graph of current gain (IGAIN) as a function of frequency (f) for a current signal amplifier in accordance with the method of this invention.

FIG. 5A is a flow-chart diagram of the method of this invention. The method begins at start block 500. Step one 501 is the application of radio frequency (RF) current signal 351 to the first stage of amplification 502. The first stage of amplification 502 includes Metal-Oxide-Silicon Field Effect Transistors (MOSFETS) of a first conductivity channel type, either P or N. (Also known as P-type or N-tpe MOSFETS, respectively) If only a single amplification stage is necessary the output signal of the first stage of amplification 502 can be taken at output step 502A. If further amplification is required, the signal from the first stage of amplification 502 is coupled to the second stage of amplification 504 which includes MOSFETs of a second channel conductivity type opposite to that of the MOSFETs included in the first stage of amplification 502. If only two stages of amplification are desired, an output signal can be taken at output step 504A. If more amplification is desired, then the signal from the second stage 504 is coupled to amplification stages 505 and 507.

Amplification stages 505 and 507 are identical to amplification stages 502 and 504, respectively. As with the previous stages, an output signal can be taken from stages 505 and 507 at output steps 505A and 507A, respectively. This allows the user to employ either three or four stages of amplification as desired.

Finally, if more than four stages of amplification are desired the process can be continued by employing five, six or "n" amplification stages as is represented by step 508.

As can be seen in FIGS. 5, 5A and 5B, the method of this invention is highly versatile and the choice of the number of MOSFET amplification stages employed is entirely at the discretion of the circuit designer depending on the level of amplification desired, the physical constraints of the system employing the method, and whether the MOSFETs employed are of traditional conductivity channel widths or are specially designed.

Figure 6:
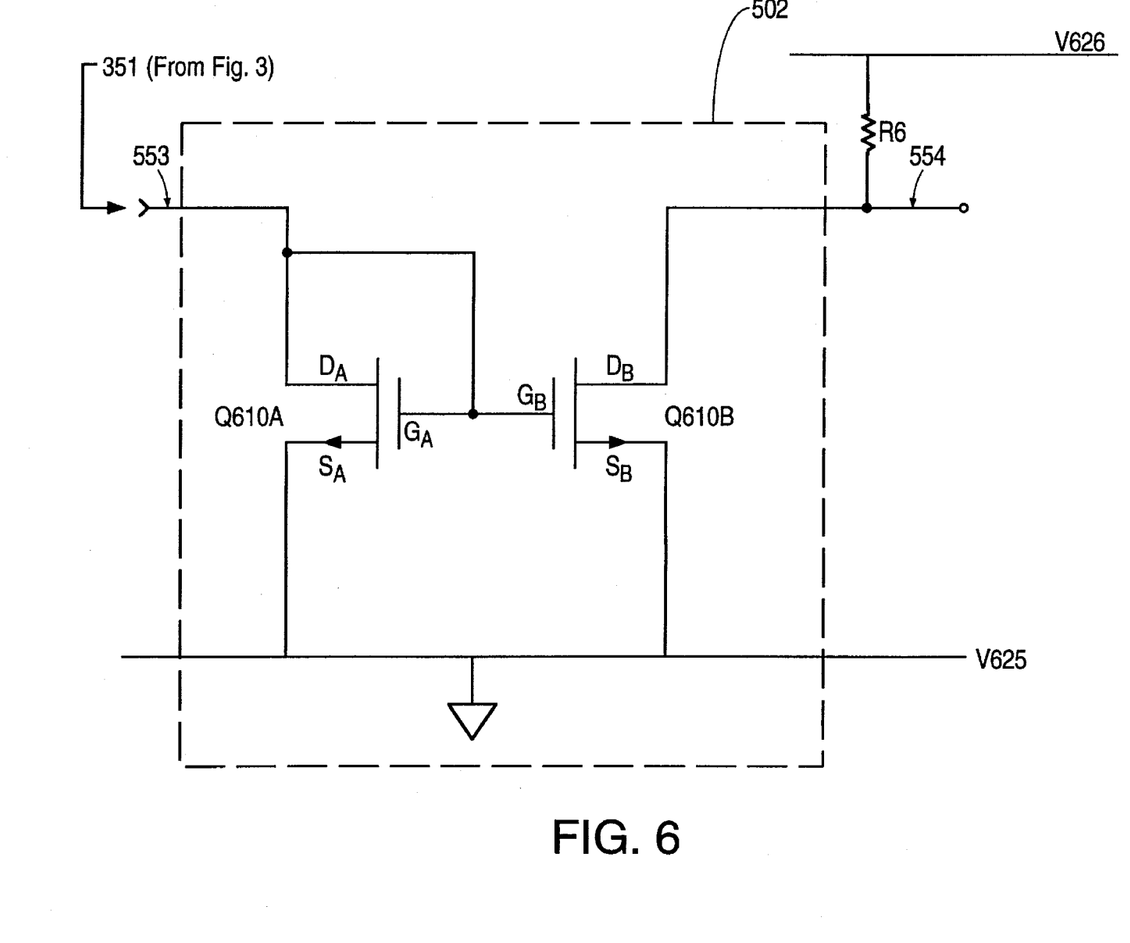
FIG. 6 is a schematic diagram of a single stage current signal amplifier in accordance with the method of this invention.
Figure 6A:
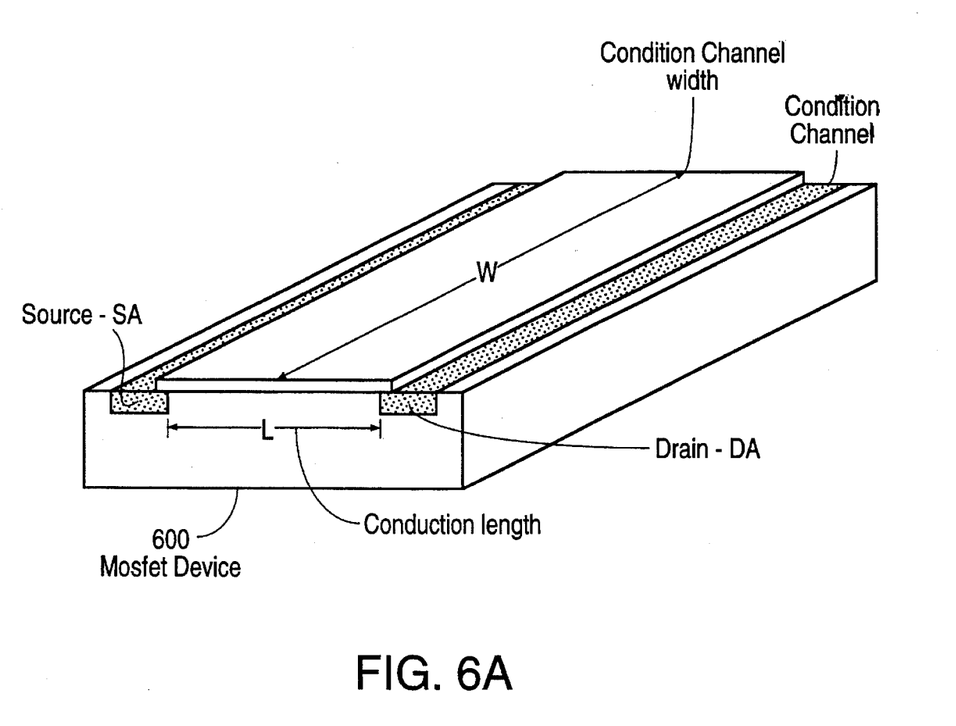
FIG. 6A is a representation of a MOSFET showing the channel width and length dimensions.

FIG. 6 is a schematic representation of one embodiment of first RF amplification stage 502. A RF current signal 351 (see FIG. 3) passes through a N-channel Metal-Oxide-Silicon Field Effect Transistor (MOSFET) Q610A from drain electrode DA to source electrode SA. Source electrode lines SA and SB of MOSFETs Q610A and Q610B, respectively, are coupled to a reference voltage source V625 which, in one embodiment, is ground. Because drain electrode line DA is coupled to gate electrode line GA, current signal 351 creates a voltage on gate electrode line GA of MOSFET Q610A. This same voltage is applied to the gate electrode line GB of MOSFET Q610B by virtue of the fact that, in this embodiment, gate electrode lines GA and GB are coupled to each other. The signal on drain electrode line DB of MOSFET Q610B is amplified current output signal 554.

High frequency amplification results because the current signal 351 creates a common voltage on the drain and gate of MOSFET Q610A. The common voltage is sufficient to cause MOSFET Q610A to conduct so that there is a voltage difference VGS between the gate and source. The oscillations in current signal 351 about current pedestal 351A are such that the changes in gate to source voltage VGS are small. Note that voltage VGS is the only voltage difference in MOSFET Q610A that changes in relationship to the input current signal, because the drain and gate are at a common voltage, as just noted. Consequently, if the changes in voltage difference VGS are small, the parasitic capacitance is not a factor in the operation of MOSFET Q610A.

The gate to source voltage (VGS) of MOSFET Q610A is identical to the gate to source voltage (VGS) of MOSFET Q610B because, as noted above, source electrode line SB of MOSFET Q610B is coupled to the same reference voltage V625 as source electrode line SA of MOSFET Q610A and the gate electrode lines GA and GB are at identical voltages as well. Consequently, RF current signal 351 results in an alternating current through MOSFET Q610B. The magnitude of the current through MOSFET Q610B is determined by selecting the geometric characteristics of the channels, e.g. channel dimension W of MOSFET 600 in FIG. 6A, of MOSFETs Q610A and Q610B.

Specifically, for the configuration of MOSFETs Q610A and Q610B in RF amplification stage 502, the current signal amplitude at drain electrode line DB of second MOSFET Q610B is related to the amplitude of the applied current signal 351 by the following relationship:

$$IOUT = \frac{W2/L2}{W1/L1} IIn$$

Where:

IOUT=current signal amplitude at drain electrode line DB of MOSFET Q610B;

IIN=current signal amplitude through MOSFET Q610A;

W1=channel width of MOSFET Q610A

W2=channel width of MOSFET Q610B

L1=channel length of MOSFET Q610A; and

L2=channel length of MOSFET Q610B

If, as is often the case, the channel lengths are equal then L1=L2 and current IOUT becomes:

$$IOUT = \frac{W_2}{W_1} IIn$$

Thus, input RF current signal 351 is amplified by the ratio of channel width W2 of MOSFET Q610B to channel width W1 of MOSFET Q610A. It follows that the RF current signal amplitude available on output line 554 of RF amplification stage 502 can be precisely controlled by a circuit designer simply by choosing the channel widths for MOSFETs Q610A and Q610B.

As will be readily recognized by those skilled in the art, the RF current signal on output line 554 can be easily transformed into a voltage signal by passing the RF current signal 554 through a resistance or reactance R6. One terminal of resistance R6 is coupled to a reference voltage V626 and the other terminal is coupled to output line 554. It follows that a voltage output can be taken across resistance R6.

The method of this invention is advantageous over prior art methods in that by using a current signal the voltage swings between the gate and source of the MOSFETs in the current amplification stage are minimized. Furthermore, as shown below, when two or more current amplification stages are connected, the voltage swings between the gate and drain are also minimized except in the final or output MOSFET where the effect of such swings is negligible. This allows high frequency (including radio frequency) current signal amplification without the parasitic capacitance, inherent in the MOSFETs and the connections between MOSFETS, degrading the frequency response of the amplification stage.

Thus, with the method of this invention, conventional MOSFETs can be employed as amplifiers at frequencies once thought to be useless for these devices. Furthermore, since the physical construction of MOSFETs allows for extremely accurate channel width control, the precision of amplification is very high and this method can be utilized for very sensitive circuitry and systems.

Figure 7:
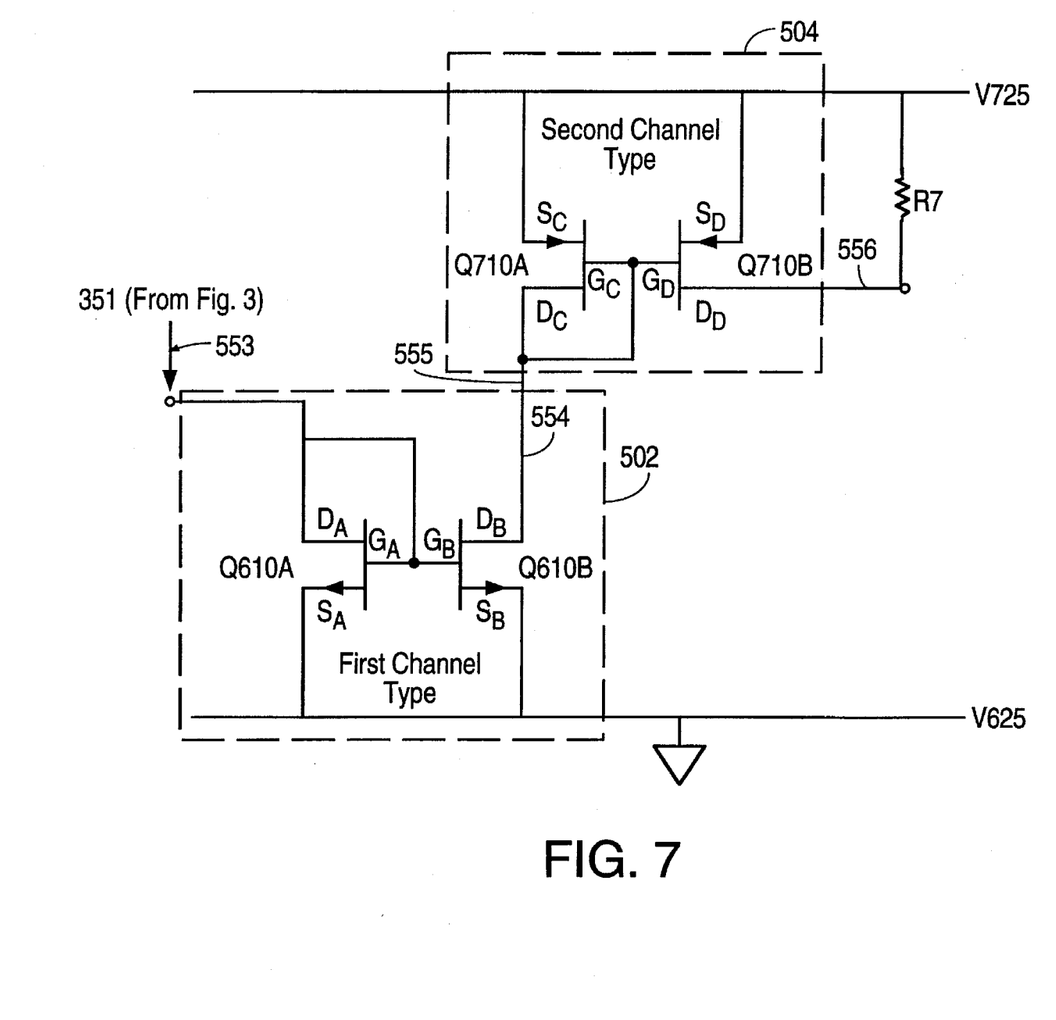
FIG. 7 is a schematic diagram of a two stage current signal amplifier in accordance with the method of this invention.

FIG. 7 is a schematic representation of one embodiment of first and second amplification stages 502 and 504 in accordance with the method of this invention. The operation of RF amplification stage 502 and MOSFETS Q610A and Q610B is set forth above and that description is incorporated herein by reference.

In FIG. 7, amplified RF current signal 554 from first amplification stage 502 is coupled to a second pair of MOSFETS Q710A and Q710B which have a P-type conductivity channel and so are referred to herein as P-channel MOSFETs.

Amplified RF current signal 554 from drain electrode line DB of MOSFET Q610B passes through MOSFET Q710A from drain electrode DC to source electrode SC. Once again the drain electrode line DC is coupled to the gate electrode line GC and this creates a voltage on the gate electrode line GC of MOSFET Q710A. This same voltage is also on gate electrode line GD of MOSFET Q710B because, in this embodiment, lines GC and GD are coupled to each other. P-channel MOSFETS Q710A and Q710B have source electrode lines SC and SD, respectively, coupled to a second reference voltage V725 which, in this embodiment, should be higher than the first reference voltage V625. Consequently, amplified RF current signal 554 results in an alternating current through MOSFET Q710B. The magnitude of the current available at the drain DD of MOSFET Q710B is determined by selecting the channel widths of MOSFETs Q710A and Q710B. As described with respect to amplification stage one 502, the current signal is amplified by the ratio of channel width W4 of MOSFET Q710B to the channel width W3 of MOSFET Q710A. The resultant current signal 556 at drain electrode line DD of MOSFET Q710B is the output signal of RF amplification stage 504. Once again it will be readily observed by one of skill in the art that the output current signal 556 can be converted to a voltage signal using a resistance or reactance R7.

The second amplification stage 504 has all the advantages over the prior art described above for the first amplification stage 502, i.e., minimal voltage swings allowing high frequency amplification and precision of amplification. Additionally, by coupling the gate electrode line GC of MOSFET Q710A to the drain electrode line DB of MOSFET Q610B the voltage between the drain and the gate (VGD) of MOSFET Q610B is pinned and held approximately constant and another potential source of voltage swings and associated parasitic capacitance problems are minimized. Hence, the cascading of current amplification stages with alternating current amplification stages made up of N-conductivity type MOSFETS directly followed by current amplification stages made up of P-type MOSFETs and so on, serves to pin down the drain to gate voltages VGD of each MOSFET to approximately constant values and minimizes or eliminates these potential sources of parasitic capacitance. Of course, the final stage of such a system will provide the output signal and will therefore not be connected to another MOSFET. It follows that there will be some swing in the drain to gate voltage of the final MOSFET. However, at this point the current signal should be appreciably amplified and the last amplification stage will simply act as a power driver in which case this final source of parasitic capacitance will be insignificant to the system.

Furthermore, utilizing two or more RF amplification stages allows greater amplification while using MOSFETS with traditional channel widths and therefore avoiding resort to expensive, specially designed devices.

Indeed, by linking three, four or "n" stages together, virtually any level of amplification can be obtained while still using traditional MOSFETS. For example, FIG. 8 shows one embodiment consisting of a series of four amplification stages coupled to create a system, in accordance with the method of this invention, capable of amplifying the input current signal 351 four times.

In this embodiment, a radio antenna input 800A supplies the AC portion 351B of input current signal 351. This AC signal is superimposed on a DC current 351A from source 800B. This is simply one embodiment and, of course, as shown above, other types of input signals can be used with the method of this invention.

Figure 8:
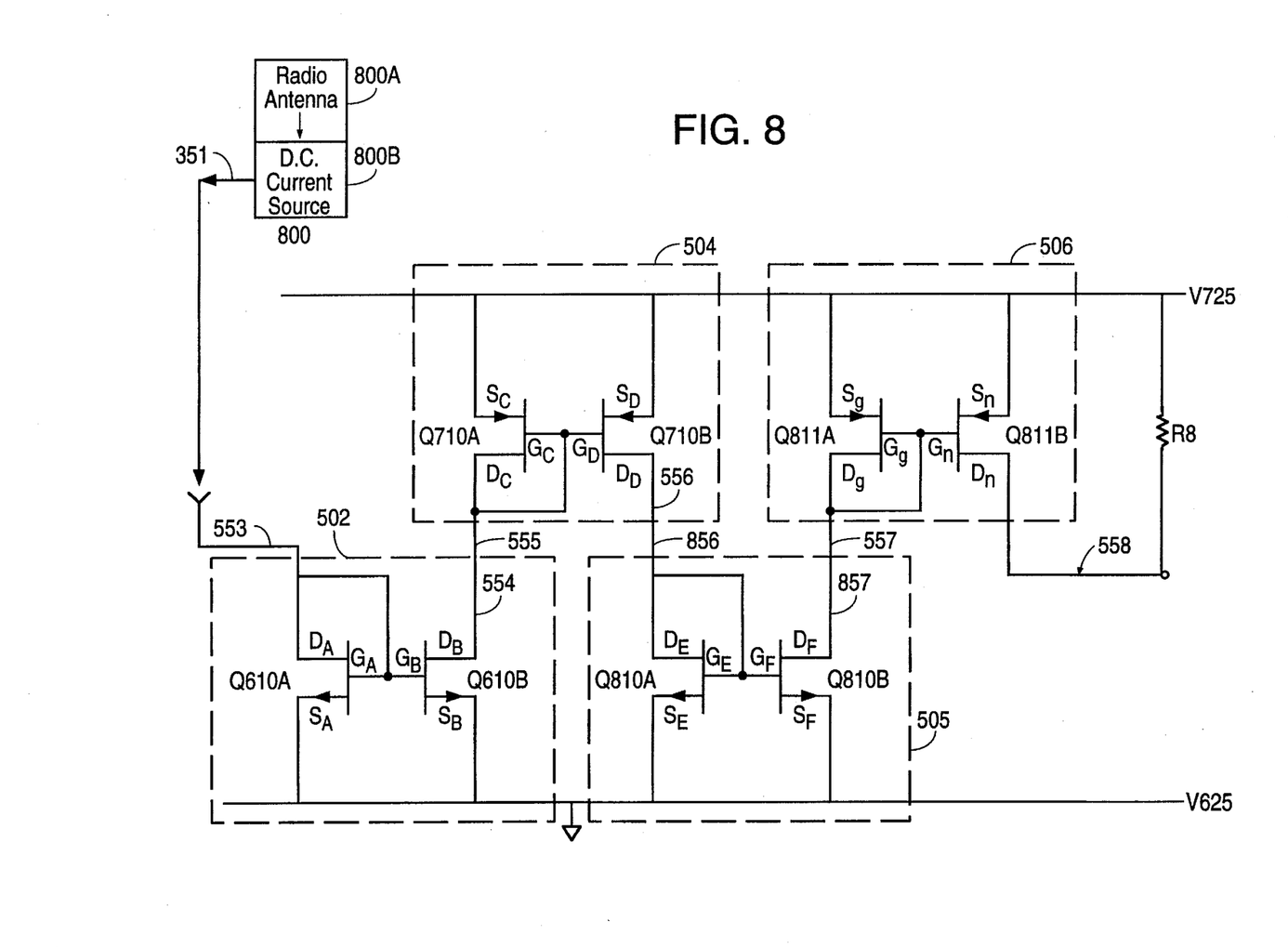
FIG. 8 is a schematic diagram of a four stage current signal amplifier in accordance with the method of this invention.

In FIG. 8, the current signal at drain electrode line DD of MOSFET Q710B is passed through MOSFET Q810A from drain electrode DE to source electrode SE. MOSFETS Q810A and Q810B are of the same channel type (here N) as MOSFETS Q610A and Q610B. The configuration of MOSFETS Q810A and Q810B is identical to the configuration of MOSFETS Q610A and Q610B, respectfully, except that the channel widths need not be the same. The operation of MOSFETS Q610A and Q610B, and therefore MOSFETs Q810A and Q810B, is set forth above and that description is incorporated herein by reference. As explained above, the signal at drain electrode line DF of MOSFET Q810B will have an amplitude equal to the signal amplitude at drain electrode line DE of MOSFET Q810A multiplied the ratio of the channel width W6 of MOSFET Q810B to the channel width W5 of MOSFET Q810A.

The signal at drain electrode line DF of MOSFET Q810B is then coupled to MOSFETs Q811A and Q811B in a manner identical to the configuration of MOSFETS Q710A and Q710B. The operation of MOSFETS Q710A and Q710B, and therefore MOSFETS Q811A and Q811B, is set forth above and that description is incorporated herein by reference. Once again, the signal is amplified by the ratio of the channel widths. That is, the amplification factor is the ratio of the channel width W8 of Q811B to the channel width W7 of Q811A.

Assuming that all channel lengths are equal, as is usually the case, the amplitude of the resultant signal available at output line 558 is given by the following formula:

$$IOUT = IIN \left( \frac{W2}{W1} \right) \left( \frac{W4}{W3} \right) \left( \frac{W6}{W5} \right) \left( \frac{W8}{W7} \right)$$

Where:
IOUT=Current signal amplitude at drain electrode line Dn of MOSFET Q811B;
IIN=Current signal amplitude through MOSFET Q610A;
W1=Channel width of MOSFET Q610A;
W2=Channel width of MOSFET Q610B;
W3=Channel width of MOSFET Q710A;
W4=Channel width of MOSFET Q710B;
W5=Channel width of MOSFET Q810A;
W6=Channel width of MOSFET Q810B;
W7=Channel width of MOSFET Q811A; and
W8=Channel width of MOSFET Q811B.

The number of amplification stages employed can include any number necessary to achieve the desired result or meet the physical constraints of the system employing this method.

As with FIGS. 5, 6 and 7 it will be apparent to those of skill in the art that by coupling the signal at drain electrode line Dn of MOSFET Q811B to a source of resistance or reactance R8 a voltage signal can be obtained.

The method of this invention allows for amplification of high frequency current signals using MOSFET devices and therefore allows for the creation of broad-band current amplifiers. This creates a new utility for not only the MOSFET devices themselves, but also for the RF frequencies involved. In addition, because MOSFET channel widths can be created with extreme precision, amplification using the claimed method can be controlled to this same high level of precision. Furthermore, the fact that a designer can couple as many amplification stages together as desired allows for extreme flexibility of design and large signal gain potential while using existing MOSFET designs.

In addition, the method set forth in this invention allows for smaller supply voltages then was possible in prior art voltage amplifiers. Indeed, in at least the embodiments shown above, the supply voltages need only be slightly greater than the sum of the threshold voltages of the MOSFETS themselves.

Finally, the gain achieved, as shown by the above expressions, is not dependent on the power supply voltage. It follows that a current amplifier in accordance with the method of this invention is a constant gain device, independent of the power supply voltage or any noise generated in the power supply. This means the output signal of the current amplifier is not contaminated by a noisy power supply. This is of particular significance given the generally "noisy" nature of computer power supplies.

The above embodiments of this invention are illustrative only. In view of this disclosure, those skilled in the art can utilize MOSFETs in a wide variety of high frequency applications. Further, by appropriate changes in biasing, known to those skilled in the art, P-channel and N-channel MOSFETs can be interchanged.

What is claimed is:

1. A method of ultra-high frequency current amplification using Metal Oxide Silicon Field Effect Transistors (MOSFETS), said method comprising the steps of:

passing an ultra-high frequency current signal through a first Metal Oxide Silicon Field Effect Transistor (MOSFET), having a first channel width, from a first electrode line to a second electrode line of said first MOSFET and coupling said first electrode line of said first MOSFET to:

(i) a control electrode line of said first MOSFET; and (ii) a control electrode line of a second MOSFET having a second channel width; and coupling said second electrode line of said first MOSFET and a second electrode line of said second MOSFET to a predetermined reference voltage, wherein the relationship between said first and second channel widths results in a predetermined amplification of said ultra-high frequency current signal on a first electrode line of said second MOSFET.

2. The method of claim 1 wherein said ultra-high frequency current source is generated using a radio antenna.

3. The method of claim 1 including the additional step of coupling a signal from said first electrode line of said second MOSFET to a source of resistance or reactance so as to create a voltage signal.

4. A method of ultra-high frequency current amplification comprising the steps of:

applying an ultra-high radio frequency current signal to an input line of a first Metal Oxide Silicon Field Effect Transistor (MOSFET) amplification stage having an output line wherein said first MOSFET amplification stage generates a first amplified ultra-high radio frequency current signal that has a predetermined relationship to said applied ultra-high radio frequency current signal; and connecting said output line of said first MOSFET amplification stage directly to an input line of a second MOSFET amplification stage having an output line wherein;
- a signal on said output line of said first MOSFET amplification stage and a signal on said input line of said second MOSFET amplification stage are the same signal;
- said second MOSFET amplification stage generates a second amplified ultra-high radio frequency current signal that has a predetermined relationship to said first amplified ultra-high radio frequency current signal at said output line of said second MOSFET amplification stage: and
- said ultra-high radio frequency current signal applied to said input line of said first MOSFET amplification stage includes ultra-high radio frequency current signals having a direct current offset.

5. The method of claim 4 including the additional step of connecting said second amplified ultra-high radio frequency current signal at the output line of said second MOSFET amplification stage directly to an input line of a third MOSFET amplification stage having an output line wherein;
- a signal on said output line of said second MOSFET amplification stage and a signal on said input line of said third MOSFET amplification stage are the same signal and;
- said third MOSFET amplification stage generates a third amplified ultra-high radio frequency current signal that has a predetermined relationship to said second amplified ultra-high radio frequency current signal at said output line of said third MOSFET amplification stage.

6. The method of claim 4 including the additional steps of:
connecting the signal at said output line of said second MOSFET amplification stage directly to an input line of a series of n MOSFET amplification stages wherein;
for a given MOSFET amplification stage in said series of n MOSFET amplification stages a signal on an output line of another MOSFET amplification stage directly preceding said given MOSFET amplification stage in said series of n MOSFET amplification stages and a signal on an input line of said given MOSFET amplification stage are the same signal and;
each MOSFET amplification stage provides a third through nth amplification of said applied ultra-high radio frequency current signal at an output line of a nth MOSFET amplification stage.

7. The method of claims 4, 5 or 6 wherein said ultra-high frequency current source is generated using a radio antenna.

8. The method of claim 6 including the additional step of coupling the signal from said output line of said nth MOSFET amplification stage to a source of resistance or reactance so as to create a voltage signal.

9. A method of ultra-high frequency current amplification using Metal Oxide Silicon Field Effect Transistors (MOSFETs), said method comprising the steps of:
passing an ultra-high frequency current signal through a first Metal Oxide Silicon Field Effect Transistor (MOSFET), having a first channel width, from a first electrode line to a second electrode line of said first MOSFET and coupling said first electrode line of said first MOSFET to
  (i) a control electrode line of said first MOSFET; and
  (ii) a control electrode line of a second MOSFET having a second channel width; and
coupling said second electrode line of said first MOSFET and a second electrode line of said second MOSFET to a first predetermined reference voltage, said first and second MOSFETs being of a first selected channel type and having said first and second channel widths, respectively, selected so as to result in a predetermined first amplification of said applied current signal at a first electrode line of said second MOSFET;
passing said amplified current signal at said first electrode line of said second MOSFET through a third MOSFET, having a third channel width, from a first electrode line to a second electrode line of said third MOSFET and coupling said first electrode line of said third MOSFET to:
  (i) a control electrode line of said third MOSFET; and
  (ii) a control electrode line of a fourth MOSFET having a fourth channel width; and
coupling said second electrode line of said third MOSFET and a second electrode line of said fourth MOSFET to a second predetermined reference voltage, said third and fourth MOSFETs being of a second selected channel type, different from said first selected channel type, and having said third and fourth channel widths, respectively, selected so as to result in a predetermined second amplification of said applied current signal at a first electrode line of said fourth MOSFET.

10. The method of claim 9 including the additional steps of:
coupling said first electrode line of said fourth MOSFET to;
  (i) a first electrode line and a control electrode line of a fifth MOSFET having a fifth channel width and;
  (ii) a control electrode line of a sixth MOSFET having a sixth channel width; and
coupling a second electrode line of said fifth and sixth MOSFETs to said first predetermined reference voltage, said fifth and sixth MOSFETs being of said first selected channel type and having said fifth and sixth channel widths, respectively, selected so as to result in a predetermined third amplification of said applied current signal at a first electrode line of said sixth MOSFET.

11. The method of claim 9 including the additional steps of:
coupling said first electrode line of said fourth MOSFET to a series of n MOSFETs coupled as set forth in claim 9, with each MOSFET having a channel width selected so as to result in a predetermined amplification of said second amplified current signal at a first electrode line of a nth MOSFET.

12. The method of claims 9, 10 or 11 wherein said ultra-high frequency current source is generated using a radio antenna.

13. The method of claims 9, 10 or 11 including the additional step of coupling a signal from said first electrode line of said nth MOSFET to a source of resistance or reactance so as to create a voltage signal.

14. A method of ultra-high frequency current amplification comprising the steps of:
passing a current signal through a first Metal Oxide Silicon Field Effect Transistor (MOSFET), having a first channel width, from a drain electrode line to a source electrode line of said first MOSFET and coupling said drain electrode line of said first MOSFET to
(i) a gate electrode line of said first MOSFET; and
(ii) a gate electrode line of a second MOSFET having a second channel width; and coupling said source electrode line of said first MOSFET and a source electrode line of said second MOSFET to a first predetermined reference voltage, said first and second MOSFETs being of a first selected channel type and having said first and second channel widths, respectively, selected so as to result in a predetermined first amplification of said applied current signal at a drain electrode line of said second MOSFET;

coupling said drain electrode line of said second MOSFET to
(i) a drain electrode line and a gate electrode line of a third MOSFET having a third channel width and;
(ii) a gate electrode line of a fourth MOSFET having a fourth channel width; and coupling a source electrode line of said third and fourth MOSFETs to a second predetermined reference voltage, said third and fourth MOSFETs being of a second selected channel type, different from said first selected channel type, and having said third and fourth channel widths, respectively, selected so as to result in a predetermined second amplification of said applied current signal at a drain electrode line of said fourth MOSFET.

15. The method of claim 14 including the additional steps of:

coupling said drain electrode line of said fourth MOSFET to;
(i) a drain electrode line and a gate electrode line of a fifth MOSFET having a fifth channel width; and
(ii) a gate electrode line of a sixth MOSFET having a sixth channel width; and coupling a source electrode line of said fifth and sixth MOSFETs to said first predetermined reference voltage, said fifth and sixth MOSFETs being of said first selected channel type and having said fifth and sixth channel widths, respectively, selected so as to result in a predetermined third amplification of said applied current signal at a drain electrode line of said sixth MOSFET.

16. The method of claim 14 including the additional steps of:

coupling said drain electrode line of said fourth MOSFET to a series of n MOSFETs coupled as set forth in claim 14, with each of said n MOSFETs having a channel width selected so as to result in a predetermined amplification of said second amplified current signal at a drain electrode line of a nth MOSFET.

17. The method of claims 14, 15 or 16 wherein said ultra-high frequency current source is generated using a radio antenna.

18. The method of claims 14, 15 or 16 including the additional step of coupling a signal from said drain electrode line of said nth MOSFET to a source of resistance or reactance so as to create a voltage signal.

19. A current amplification method comprising the steps of:

amplifying an ultra-high frequency current signal using a first plurality of Metal Oxide Silicon Field Effect Transistors (MOSFETs) to generate an amplified ultra-high frequency current signal; and amplifying said amplified ultra-high frequency current signal using a second plurality of MOSFETs, wherein said first plurality of MOSFETs is directly connected to said second plurality of MOSFETs such that a signal on an output line of said first plurality of MOSFETs and a signal on an input line of said second plurality of MOSFETs are the same signal; and said ultra-high radio frequency current signal includes ultra-high radio frequency current signals having a direct current offset.

20. The method of claim 19 wherein said ultra-high frequency current signal has a frequency of about 900 megahertz.

21. (Amended) The method of claim 19 wherein said ultra-high frequency current signal has a frequency of about 2.4 gigahertz.

22. A method of broad-band current amplification comprising the steps of:

applying a current signal to an input line of a first Metal Oxide Silicon Field Effect Transistor (MOSFET) amplification stage having an output line wherein said first MOSFET amplification stage generates a first amplified current signal that has a predetermined relationship to said applied current signals, wherein said current signal applied to said input line of said first MOSFET amplification stage is a current signal having a frequency in the range from about a zero frequency to ultra-high frequencies; and connecting said output line of said first MOSFET amplification stage directly to an input line of a second MOSFET amplification stage having an output line wherein;
a signal on said output line of said first MOSFET amplification stage and a signal on said input line of said second MOSFET amplification stage are the same signal; and
said second MOSFET amplification stage generates a second amplified current signal that has a predetermined relationship to said first amplified current signal at said output line of said second MOSFET amplification stage.

23. The method of claim 22 including the additional step of connecting said second amplified current signal at the output line of said second MOSFET amplification stage directly to an input line of a third MOSFET amplification stage having an output line, wherein;
a signal on said output line of said second MOSFET amplification stage and a signal on said input line of said third MOSFET amplification stage are the same signal and;
said third MOSFET amplification stage generating a third amplified current signal that has a predetermined relationship to said second amplified current signal at said output line of said third MOSFET amplification stage.

24. The method of claim 22 including the additional steps of:

connecting the signal at said output line of said second MOSFET amplification stage directly to an input line of a series of n MOSFET amplification stages wherein;
for a given MOSFET amplification stage in said series of n MOSFET amplification stages a signal on an output line of another MOSFET amplification stage directly preceding said given MOSFET amplification stage in said series of MOSFET amplification stages and a signal on an input line of said given MOSFET amplification stage are the same signal and;
each MOSFET amplification stage provides a third through nth amplification of said current signal at an output line of a nth MOSFET amplification stage.

25. A method of broad-band current amplification comprising the steps of:

amplifying a current signal using a first plurality of Metal Oxide Silicon Field Effect Transistors (MOSFETs) to generate an amplified current signal, wherein said current signal amplified by said first plurality of MOSFETS is a current signal having a frequency in the range from about a zero frequency to an ultra-high frequency; and amplifying said amplified current signal using a second plurality of MOSFETs, wherein said first plurality of MOSFETs is directly connected to said second plurality of MOSFETs such that a signal on an output line of said first plurality of MOSFETs and a signal on an input line of said second plurality of MOSFETs are the same signal.

26. The method of claim 25 wherein said current signal has a frequency range including 900 megahertz.

27. The method of claim 25, wherein said current signal has a frequency range including 2.4 gigahertz.

28. The method of claim 4 including the additional step of coupling the signal from said output line of said second MOSFET amplification stage to a source of resistance or reactance so as to create a voltage signal.

29. The method of claim 5 including the additional step of coupling the signal from said output line of said third MOSFET amplification stage to a source of resistance or reactance so as to create a voltage signal.

* * * * *